United States Patent [19]

Le Corre et al.

[11] Patent Number: 4,815,583

[45] Date of Patent: Mar. 28, 1989

[54] DEVICE FOR THE HANDLING OF SMALL-SIZED SEMI-CONDUCTOR CHIPS

[75] Inventors: Jean-Luc Le Corre, Montreuil; Georges Noel, Torcy, both of France

[73] Assignee: Thomson Hybrides et Microondes, Paris, France

[21] Appl. No.: 108,452

[22] Filed: Oct. 15, 1987

[30] Foreign Application Priority Data

Oct. 17, 1986 [FR] France ............................ 86 14422

[51] Int. Cl.⁴ ............................................. B65G 47/14
[52] U.S. Cl. .................................. 198/396; 198/453; 198/691
[58] Field of Search ...................... 198/381, 396, 472.1, 198/691, 453; 221/160, 171

[56] References Cited

U.S. PATENT DOCUMENTS 2,891,668  6/1959  Hunt .................. 198/472.1
4,081,069  3/1978  Ond .................... 198/381

FOREIGN PATENT DOCUMENTS 813016  7/1951  Fed. Rep. of Germany .
957494  5/1964  United Kingdom .

Primary Examiner—Joseph E. Valenza
Attorney, Agent, or Firm—Oblon, Fisher, Spivak, McClelland & Maier

[57] ABSTRACT

A device is used to handle small-sized semiconductor chips, such as ultra-high frequency chips delivered loose. In order to lift up these chips one by one at a precise point by means of a pipette, the device uses the charges of static electricity which make the chips adhere to an endless tape made of plastic. In a first, vertical part, the tape is loaded with chips in passing through a feeder bin. A stop retains all the chips on one side of the tape, and another stop lets through only those chips that are flat on the other side of the tape. In a second, horizontal part the tape passes through a tunnel in which the chips are oriented and then stored and taken up by a suction pipette. The invention can be applied to the assembly of semi-conductor chips in packages or on substrates.

32 Claims, 2 Drawing Sheets

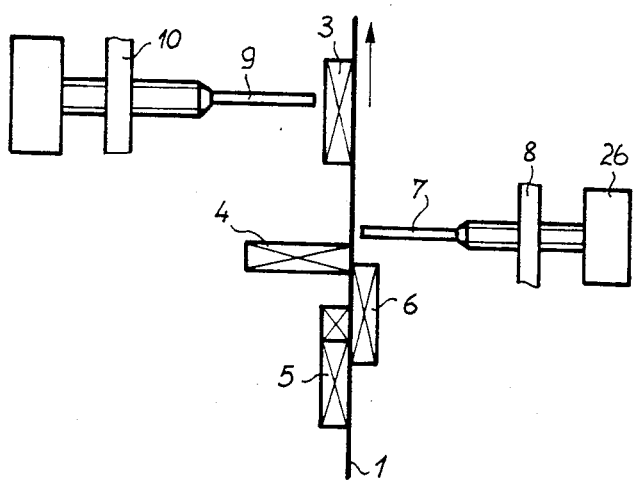
FIG_1
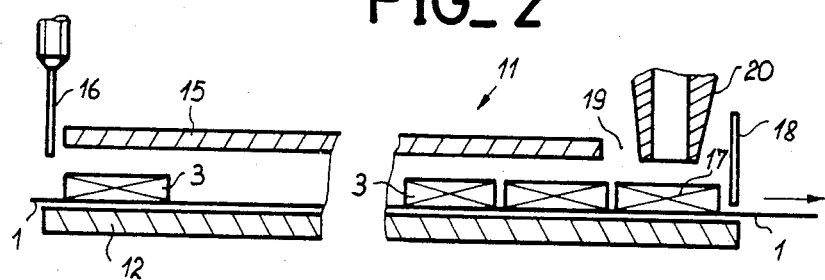
FIG_2
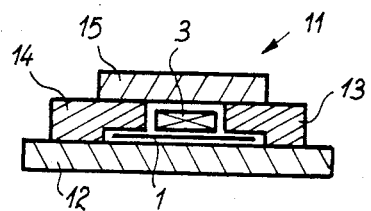
FIG_3

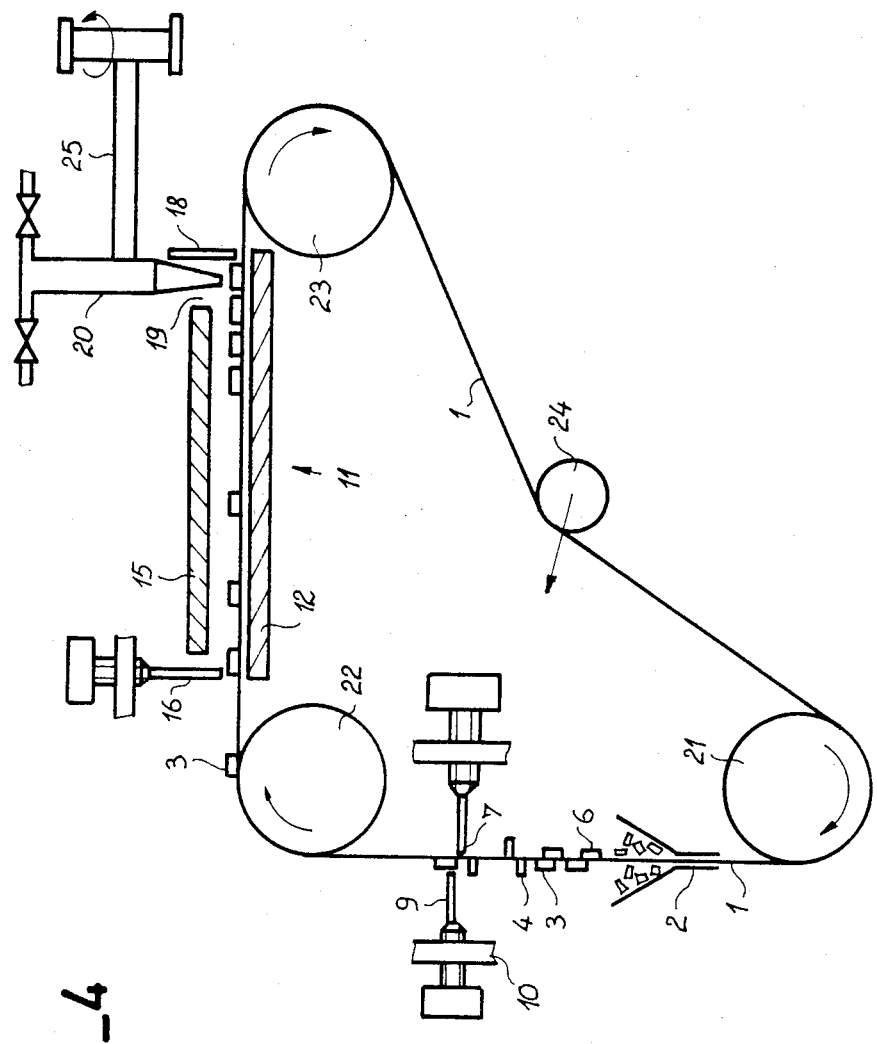
FIG_4

DEVICE FOR THE HANDLING OF SMALL-SIZED SEMI-CONDUCTOR CHIPS

BACKGROUND OF THE INVENTION

1. Field of the Invention

The present invention pertains to a device for the handling of chips for semi-conductor devices, such as diodes or transistors, so that these chips can be presented at a precise location where they are taken up by a pipette to be fixed to a socket by an automatic assembly line.

2. Description of the Prior Art

At present, in the semi-conductor industry, it is still necessary to manipulate bare chips so that they can be fixed on a support with connections giving access to the electrical function, and often also comprising a protective cover. The support may be the socket of a diode package or transistor package of the TO 39 type, the grid of an integrated circuit package (DIL type), or the substrate of a hybrid circuit.

There are means and method which are very appropriate as long as the chips to be handled have dimensions greater than approximately 1 mm square. For example, in one prior art method, a slice of semi-conducting material, out of which the devices have been made, is laid on a plastic tape. After being cut out by laser or with a cutting diamond, the sheet of plastic matter is stretched. At this point, the chips are presented in order and spaced out so that they can be taken up with a suction pipette.

However, this is not the case with very small chips, ranging from 0.25 mm square to 0.4–0.5 mm square, corresponding to diodes or ultra-high frequency transistors (where it is known that the sizes become smaller as the frequency becomes higher. The diodes may also be optoelectronic diodes, of the electroluminescent or laser type. To cut out the layer of semi-conducting material into chips with such small sizes and such low weights, the slice has to be bonded to a base (for example, a copper plate). The chips are then unbonded and cleaned of bonder, and, at that moment, they are in a loose state.

SUMMARY OF THE INVENTION

The apparatus and method according to the invention provide for the manipulation of these chips in loose state, to present them before a suction pipette, by relying on the adherence developed by static electricity of a tape of plastic material such as polyester. The apparatus comprises a bin and a sort of vertical funnel, into which the chips are poured. A tape of plastic, exhibiting a static effect, crosses the bin vertically and carries upwards, along with it, chips which adhere to it by static electricity. A first adjustable stop, which rubs against a side of the ribbon, makes all the chips adhering to that side of the ribbon fall back into the bin. A second adjustable stop, on the other side of the tape, stops all the chips which adhere perpendicularly to the tape. Thus, after the two stops, the tape no longer carries any chips other than those adhering by a main side to only one side of the tape. The tape then penetrates a horizontal tunnel of appropriate width and height, which places the chips in the right direction if they are positioned slantwise. At the end of the tunnel, a stop and an upper window stop the chips and make it possible to take them up with a suction pipette in an automatic assembly system.

More precisely, the invention pertains to a device for the handling of small-sized semi-conductor chips, designed to take up chips in loose state from a feeder bin and to present them one by one, properly oriented and in a fixed position, before a lifting means. In the device the chips are conveyed from the feeder point to the lifting point by means of a plastic carrier tape with a slow running movement, a tape to which they adhere by static electricity.

BRIEF DESCRIPTION OF THE DRAWINGS

The invention will be better understood from the following detailed description of the apparatus and method for handling semi-conductor chips, made with reference to the appended figures.

FIG. 1 is a diagram of the device for lifting chips from a bin according to the invention.

FIG. 2 is a diagram of the device for orienting and storing chips oriented in a tunnel according to the invention.

FIG. 3 is a diagram of a longitudinal section of the tunnel according to the invention.

FIG. 4 is a simplified diagram of the chip-handling device according to the invention.

DESCRIPTION OF THE PREFERRED EMBODIMENT

For the chips of semi-conductor devices to be presented one by one, in a precise position, from a volume in which a great number of chips are stored loose, the chips must be:

taken up, first of all, when arranged flat on a support, a requirement implying the elimination of chips which lie on the support on their thin end;

all pointed in the same direction, along an axis of the support, a requirement implying that those chips that are flat on the support, but are oriented slantwise with respect to an axis of reference, must be oriented in the right direction; and stored in a place where a lifting device such as a suction pipette can lift them, one by one, and then deposit each lifted chip on a socket to which it is subsequently fixed.

FIG. 1 shows a diagram of the chip-lifting device according to the invention. The basis of this device is the well-known phenomenon of static electricity which develops and is stored in the insulating materials such as plastics. The support used as a vector for the movement of the chips is a ribbon of plastic material 1. The ribbon of plastic material 1 is preferably an endless loop rotating in the apparatus according to the invention. Among numerous possibilities, polyester films, such as those used in magnetic recording tapes, have the flexibility and the static electricity properties that make them perfectly suitable.

The ribbon of plastic material 1 passes through a funnel-shaped bin 2 which is not shown in FIG. 1, but which appears in FIG. 4. The semi-conductor chips are poured loose into the funnel-shaped bin. The ribbon of plastic material 1 is arranged, in this zone of the device, substantially along a perpendicular line, and it moves slowly from the bottom upwards, vertical to the position of the chips, of course. It is charged with static electricity, partly through friction on the funnel-shaped bin 2 and partly through friction with the semi-conductor chips. Hence, in its movement, the ribbon of plastic material 1 carries along chips which adhere to the main sides of the ribbon by static attraction.

Four chips 3 to 6 are shown in FIG. 1. The first operation consists in keeping chips on only one first main side of the tape 1, the side that will subsequently become the upper side of the tape (see FIGS. 2 and 4) when it moves horizontally. For this, all the chips, such as the chip 6, which adhere to the second main side (which will become the lower side of the tape) are stopped by a first stop 7 which rubs against the ribbon of plastic material 1, or which is at a distance from it of less than the thickness of one chip. The chips stopped by the first stop 7 fall back into the funnel-shaped bin 2. It is convenient for the first stop 7 to have an adjustable position. Advantageously, the first stop 7 is borne by a threaded rod which moves, by the rotation of a knurled knob 26, in a fixed support 8.

On the so-called upper side of the ribbon of plastic material 1, the semi-conductor chips may take various positions. They are sorted out by a second stop 9, which is of the same type as the first stop 7 and which is adjustable with respect to the ribbon of plastic material 12 and a fixed support 10. The distance between the second stop 9 and the upper side of the ribbon of plastic material 1 can be adjusted to let through, while the ribbon runs past, chips such as the chip 3 and 5 which adhere flat to the ribbon of plastic material 1 (i.e., which adhere by one of their main sides). By contrast, a chip such as the chip 4, which adheres to the ribbon of plastic material 1 by its thin side, is stopped by the second stop 9. Depending on each case and on static attraction, either it falls back into the funnel-shaped bin 2 or the second stop 9 makes it fall flat on the ribbon plastic material 1.

At the end of this first zone of the chip-handling device according to the invention, there art thus chips which are:
placed on only one side on a supporting tape,
arranged in linear order along the tape, and
flat on the tape.

However, while certain chips such as the chips 3 are oriented with two lateral sides parallel to the axis along which the carrier tape runs, others such as the chip 5 are slantwise or crosswise. None of their lateral sides is parallel to the running axis of the ribbon of plastic material 1. The chips in this latter condition, representing the majority, are therefore oriented and stored in a second zone of the apparatus shown in FIG. 2.

The second zone consists of a relatively long (about 5 to 10 centimetres) tunnel 11, the inlet part of which, seen in the direction in which the chip-supporting tape is running, makes it possible to orient the chips along the running axis while the central part is used to store them and the outlet part is used to take them up one by one.

The reading of FIG. 2, which shows both ends of the tunnel 11, is made easier and supplemented by FIG. 3 which represents a cross-section of the tunnel.

While the first lifting zone of the apparatus is substantially vertical, the second zone of the tunnel is horizontal.

The tunnel 11 comprises a plane and smooth base 12, on which lies the ribbon of plastic material 1, the upper side of which carries chips. The tunnel 11 also has two lateral guides 13 and 14, the internal sides of which are also linear and smooth so that the chips, carried by the ribbon of plastic material 1, can slip through. The lateral guides 13 and 14 are joined to the base 12 but at least one of them (14 for example) can have its position adjusted so that the interval between the two lateral guides is slightly greater than the horizontal dimensions of the chip so as to prevent the chips from being blocked in the tunnel. The lateral guides 13 and 14 are, moreover, chamfered at the base according to the width of the ribbon plastic material 1. A ribbon of plastic material 1 with a width of 3 or 5 mm., for example, carries chips which may be 0.25 mm to 0.54 mm. square, for example. The width of the tunnel 11 is therefore slightly greater than 0.25 to 0.54 mm., but the lateral guides 13 and 14 are chamfered so that they do not block the ribbon of plastic material 1 but, on the contrary, guide it.

The tunnel 11 is lined with a plate 15, which is generally detachable and transparent, so that that the storage of the chips aligned in the central part can be supervised. The plate 15 is advantageously made of glass or of some transparent or semi-transparent material. It is enough for the plate 15 to be about 1 mm. from the base 12 for the chips to move in the tunnel 11 without getting attached to the plate 15.

The inlet part of the tunnel 11 has a third stop 16, identical to the stops 7 and 9. The function of the third stop 16 is to tip over those chips which, after passing by the second stop 9, have taken an upright position on the edge, like the chip 4, for some reason or other.

At the entrance to the tunnel 11, the lateral guides 13 and 14 are bevelled so as to form a funnel opening out on to the central part of the tunnel 11. There are two purposes in this:
To bring the chips adhering to the edges of the upper side of the ribbon of plastic material 1 to the axis of the ribbon of plastic material 1, and hence, to present these chips in the axis of the tunnel 11,
To orient the chips which, like the chip 5 in FIG. 1, are slantwise with respect to the axis along which the ribbon of plastic material 1 is running. The bevelled shape of the lateral guides 13 and 14 redirects these chips and present them in the tunnel 11 with their lateral sides parallel to the internal sides of the tunnel 11.

In the central part of the tunnel 11, chips 3 aligned between the lateral guides 13 and 14, come to a stop against the first chip 17, in a waiting position in the outlet part of the tunnel 11. Hence, the chips are stored and presented in the right position to be lifted one by one.

A fourth stop 18, at the outlet of the tunnel, is adjusted so as to come closer to the ribbon of plastic material 1 by a distance which is smaller than the thickness of one chip. The fourth stop 18 thus blocks the chips which, although they are attached to the ribbon of plastic material 1 by static electricity, slip on the ribbon of plastic material 1 and remain in place in the tunnel 11.

An opening 19 in the plate 15 of the tunnel 11 has dimensions which are at least equal to those of the first chip 17 and those of the handling suction pipette 20. Each chip is taken up by the pipette 20 and deposited on the substrate of the package or hybrid circuit on which it has to be fixed.

Before being finally fixed on its substrate, the chip will be identified electrically to ascertain that it is in the right direction: for example, in a diode, the chip will be identified electrically to recognize the semiconductor substrate side and the active layer or junction side so that the chip is not soldered on the wrong side. But these identification means are well known and do not come within the scope of the invention.

FIG. 4 shows a simplified diagram of the semiconductor chip handing device according to the invention. The entire device can be easily joined to a rigid and stable vertical support, such as a plate of duralumin, which acts as a reference plane for the various parts of the device.

The ribbon of plastic material 1 carrying the chips is an endless loop and surrounds three pulleys or equivalent rounded slip surfaces 21, 22, and 23. The axes of the pulleys 21 and 22 are substantially in one and the same vertical plane, while the axes of the pulleys 22 and 23 are in a horizontal plane corresponding to the tunnel 11. At least one of the three pulleys (21 for example) is driven by an electrical motor so that it communicates a running speed to the ribbon of plastic material 1. The running speed substantially corresponds to the flow rate of the chips picked up by the pipette 20. A fourth pulley 24 or a tensor applies a tension to the ribbon of plastic material 1.

The funnel-shaped bin 2, through which the ribbon of plastic material 1 passes, is set between the two pulleys 21 and 22. The funnel-shaped bin 2 is fed with chips in loose state and loads the ribbon of plastic material 1 with chips 3, 4, and 6 which adhere to both of its sides. After first and second stops 7 and 9, the ribbon of plastic material 1 no longer has any chips other than chips laid flat on one side only.

The tunnel 11 is set between the pulleys 22 and 23. At its outlet, the suction pipette 20 is joined to an arm 25 which can be moved around an axis of rotation to manipulate the chips.

The axes of the pulleys, the fixed supports 8 and 10 of the first and second stops 7 and 9, the tunnel 11, and, advantageously, the arm 25 of the handling pipette 20 are all joined to the vertical supporting plate of the device which is, furthermore, shielded against vibrations so that the pipette can be exactly positioned with respect to the chip to be lifted.

Of course, the entire apparatus is designed so that the electrostatic charges that develop in the plastic carrier tape are not shunted to the ground. On the contrary, the tape may be deliberately charged by means of an appropriate rubbing device which engenders electrostatic charges.

The device may take the shape of further improved embodiments (for example automated ones) as compared with those described herein without leaving the scope of the invention, which is described in the following claims.

What is claimed is:

1. A device for the handling of small-sized semi-conductor chips, said device comprising:
    (a) a feeder bin which, in use, contains small-sized semi-conductor chips in a loose state;
    (b) a plastic carrier tape which passes through said feeder bin, said plastic carrier tape having a first side and a second side;
    (c) first means for moving said plastic carrier tape through said feeder bin;
    (d) second means for charging said plastic carrier tape with static electricity;
    (e) a first stop positioned adjacent to the first side of said plastic carrier tape downstream of said feeder bin, said first stop being sized, shaped, and positioned to prevent passage of semiconductor chips adhered to the first side of said plastic carrier tape by said second means; and
    (f) a second stop positioned adjacent to the second side of said plastic carrier tape downstream of said feeder bin, said second stop being sized, shaped, and positioned to prevent passage of those semiconductor chips adhered to the second side of said plastic carrier tape by said second means that are not flat on said plastic carrier tape.

2. A device as recited in claim 1 wherein the position of said first stop is adjustable.

3. A device as recited in claim 1 wherein the position of said second stop is adjustable.

4. A device as recited in claim 1 wherein said plastic carrier tape passes through said feeder bin vertically.

5. A device as recited in claim 1 and further comprising third means for orienting the semiconductor chips on the second side of said plastic carrier tape so that they are all oriented in the same way.

6. A device as recited in claim 5 wherein said third means comprise two lateral guides positioned transversely of said plastic carrier tape.

7. A device as recited in claim 5 wherein said plastic carrier tape is at least substantially horizontal when the semiconductor chips are oriented by said third means.

8. A device as recited in claim 5 wherein said third means comprise:
    (a) a flat, smooth, and rigid base on which said plastic carrier tape slides;
    (b) two lateral guides spaced apart by a distance that is slightly greater than the lateral dimensions of the semiconductor chips, each of said two lateral guides having a base that is chamfered to let said plastic carrier tape slip through; and
    (c) a lid made of a transparent material in which there is an opening the dimensions of which are at least slightly larger than the dimensions of a semiconductor chip.

9. A device as recited in claim 8 and further comprising a third stop positioned adjacent to the second side of said plastic carrier tape upstream of said third means, said third stop being sized, shaped, and positioned to prevent passage of the semiconductor chips adhered to the second side of said plastic carrier tape by said second means that are not flat on said plastic carrier tape.

10. A device as recited in claim 8 and further comprising a fourth stop positioned adjacent to the second side of said plastic carrier tape downstream of said third means, said fourth stop being sized, shaped, and positioned to prevent passage of semiconductor chips adhered to the second side of said plastic carrier tape by said second means.

11. A device as recited in claim 8 wherein the upstream ends of said two lateral guides are beveled to orient the semiconductor chips so that their lateral edges are parallel to the direction of motion of said plastic carrier tape.

12. A device as recited in claim 8 and further comprising a suction pipette disposed adjacent to said third means for removing the semiconductor chips from said plastic carrier tape through said opening.

13. A device as recited in claim 1 wherein said first means comprises a plurality of pulleys over which siad plastic carrier tape is trained.

14. A device as recited in claim 13 wherein two of said plurality of pulleys are at least substantially located in the same vertical plane and two of said plurality of pulleys are at least substantially located in the same horizontal plane.

15. A device as recited in claim 1 and further comprising a suction pipette downstream of said first and second stops for removing the semiconductor chips from said plastic carrier tape.

16. A device as recited in claim 1 wherein said bin is funnel-shaped.

17. A device for the handling of small-sized semi-conductor chips, said device comprising:
(a) a feeder bin which, in use, contains small-sized semi-conductor chips in a loose state;
(b) a plastic carrier tape which passes through said feeder bin, said plastic carrier tape having a first side and a second side;
(c) first means for moving said plastic carrier tape through said feeder bin;
(d) second means for charging said plastic carrier tape with static electricity;
(e) a first stop positioned adjacent to the first side of said plastic carrier tape downstream of said feeder bin, said first stop being sized, shaped and positioned to prevent passage of semiconductor chips adhered to the first side of said plastic carrier tape by said second means; and
(f) third means for orienting the semiconductor chips on the second side of said plastic carrier tape so that they are all oriented in the same way.

18. A device as recited in claim 17 wherein the position of said first stop is adjustable.

19. A device as recited in claim 17 and further comprising a second stop positioned adjacent to the second side of said plastic carrier tape downstream of said feeder bin, said second stop being sized, shaped, and positioned to prevent passage of those semiconductor chips adhered to the second side of said plastic carrier tape by said second means that are not flat on said plastic carrier tape.

20. A device as recited in claim 19 wherein the position of said second stop is adjustable.

21. A device as recited in claim 17 wherein said plastic carrier tape passes through said feeder bin vertically.

22. A device as recited in claim 17 wherein said third means comprise two lateral guides positioned transversely of said plastic carrier tape.

23. A device as recited in claim 17 wherein said plastic carrier tape is at least substantially horizontal when the semiconductor chips are oriented by said third means.

24. A device as recited in claim 17 wherein said third means comprise:

(a) a flat, smooth, and rigid base on which said plastic carrier tape slides;
(b) two lateral guides spaced apart by a distance that is slightly greater than the lateral dimensions of the semiconductor chips, each of said two lateral guides having a base that is chamfered to let said plastic carrier tape slip through; and
(c) a lid made of a transparent material in which there is an opening the dimensions of which are at least slightly larger than the dimensions of a semiconductor chip.

25. A device as recited in claim 24 and further comprising a third stop positioned adjacent to the second side of said plastic carrier tape upstream of said third means, said third stop being sized, shaped, and positioned to prevent passage of the semiconductor chips adhered to the second side of said plastic carrier tape by said second means that are not flat on said plastic carrier tape.

26. A device as recited in claim 24 and further comprising a fourth stop positioned adjacent to the second side of said plastic carrier tape downstream of said thrid means, said fourth stop being sized, shaped, and positioned to prevent passage of semiconductor chips adhered to the second side of said plastic carrier tape by said second means.

27. A device as recited in claim 24 wherein the upstream ends of said two lateral guides are beveled to orient the semiconductor chips so that their lateral edges are parallel to the direction of motion of said plastic carrier tape.

28. A device as recited in claim 24 and further comprising a suction pipette disposed adjacent to said third means for removing the semiconductor chips from said plastic carrier tape through said opening.

29. A device as recited in claim 17 wherein said first means comprises a plurality of pulleys over which said plastic carrier tape is trained.

30. A device as recited in claim 29 wherein two of said plurality of pulleys are at least substantially located in the same vertical plane and two of said plurality of pulleys are at least substantially located in the same horizontal plane.

31. A device as recited in claim 17 and further comprising a suction pipette downstream of said first and second stops for removing the semiconductor chips from said plastic carrier tape.

32. A device as recited in claim 17 wherein said bin is funnel-shaped.

* * * * *